（12） United States Patent
Tsai et al.

(10) Patent No.: US 9,741,825 B1
(45) Date of Patent: Aug. 22, 2017

(54) METHOD FOR MANUFACTURING FIELD EFFECT TRANSISTOR HAVING WIDENED TRENCH

(71) Applicant: TAIWAN SEMICONDUCTOR CO., LTD., New Taipei (TW)

(72) Inventors: Yi-Lung Tsai, New Taipei (TW); Aryadeep Mrinal, New Taipei (TW); Mohammad Amanullah, New Taipei (TW); Po-Wen Yang, New Taipei (TW); Shu-Siang Liang, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 15/372,674

(22) Filed: Dec. 8, 2016

(51) Int. Cl.
*H01L 29/66* (2006.01)
*H01L 29/417* (2006.01)
*H01L 29/423* (2006.01)
*H01L 29/78* (2006.01)
*H01L 21/28* (2006.01)
*H01L 21/3105* (2006.01)
*H01L 21/02* (2006.01)
*H01L 21/311* (2006.01)
*H01L 29/40* (2006.01)

(52) U.S. Cl.
CPC .. *H01L 29/66666* (2013.01); *H01L 21/02274* (2013.01); *H01L 21/28035* (2013.01); *H01L 21/31053* (2013.01); *H01L 21/31116* (2013.01); *H01L 29/401* (2013.01); *H01L 29/41741* (2013.01); *H01L 29/4236* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 2004/0183136 A1* | 9/2004 | Williams | H01L 29/4236 257/369 |
| 2012/0104490 A1* | 5/2012 | Yilmaz | H01L 29/7827 257/330 |
| 2015/0072493 A1* | 3/2015 | Chan | H01L 29/66666 438/270 |
| 2015/0076592 A1* | 3/2015 | Asahara | H01L 29/4236 257/330 |

(Continued)

*Primary Examiner* — Asok K Sarkar
(74) *Attorney, Agent, or Firm* — Muncy, Geissler, Olds & Lowe, P.C.

(57) ABSTRACT

A method for manufacturing a field effect transistor having a widened trench forms sequentially an epitaxial layer, a trench, an oxidation layer, a trench-oxidation layer, a polysilicon layer, a residual oxidation layer, an electrode portion, a lower trench, a widened trench, a gate portion, a body region, a source region, an interlayer dielectric layer and a source electrode. The trench is formed at the epitaxial layer. The oxidation layer, the trench-oxidation layer and a polysilicon layer are then formed. The residual oxidation layer and the electrode portion are formed in the trench by etching the polysilicon layer and the trench-oxidation layer. The lower trench is formed by etching the epitaxial layer. The widened trench is formed by widening a portion of the trench away from a trench bottom so as to have the electrode portion and the residual oxidation layer disposed at the lower trench.

10 Claims, 16 Drawing Sheets

(56) References Cited

U.S. PATENT DOCUMENTS

| | | | |
|---|---|---|---|
| 2015/0279962 A1* | 10/2015 | Poelzl | H01L 29/407 438/138 |
| 2015/0295080 A1* | 10/2015 | Lee | H01L 29/7813 257/330 |
| 2016/0099351 A1* | 4/2016 | Hebert | H01L 29/7828 257/331 |
| 2017/0125531 A9* | 5/2017 | Lee | H01L 29/4236 |

* cited by examiner

METHOD FOR MANUFACTURING FIELD EFFECT TRANSISTOR HAVING WIDENED TRENCH

BACKGROUND OF INVENTION

1. Field of the Invention

The invention relates to a method for manufacturing a field effect transistor having a widened trench, and more particularly to the method for manufacturing the field effect transistor that widens a trench thereof to form a trench bottom and a widened trench with a larger width.

2. Description of the Prior Art

With booming progress in semiconductor technology, various advanced manufacturing processes have been introducing to produce the field effect transistors, especially the metal-oxide-semiconductor field effect transistors (MOSFET).

Refer now to FIG. 1 through FIG. 3; where FIG. 1 is a schematic view of a conventional deposited polysilicon layer in the prior art, FIG. 2 is a schematic view of another conventional deposited polysilicon layer in the prior art, and FIG. 3 is a schematic view of a conventional etched polysilicon layer in the prior art. As shown, while in producing a conventional field effect transistor PA1, since a trench PA11 has a narrow width to form a structure with a high aspect ratio, so an overhang structure PA121 (as shown in FIG. 1) is easily formed during a process to form a polysilicon layer PA12. It is noted that an oversized overhang structure PA121 would lead to an early seal of the trench PA11 at the stage of forming the polysilicon layer PA12. As a result, a poly seam A (as shown in FIG. 2) would be formed. The poly seam A would pack processing gas inside the trench PA11. Hence, in the following processes, the packed gas inside the trench PA11 would be heated to diffuse and further to damage elements or to reduce liability of the chip.

In addition, as shown in FIG. 3, while in an etching process, the poly seam A would cause uneven thicknesses to the etched layers. Thus, an unstable critical voltage would be met. If a gate is energized upon existence of a poly seam A, excessive current leak is quite possible. Thus, while in producing a trench of a MOSFET, an improvement to eliminate the poly seam is definitely urgent to the art.

SUMMARY OF THE INVENTION

In view of existing shortcomings of the current structure and manufacturing method of the MOSFET in element damages, low chip reliability, unstable critical voltages and excessive current leakage mainly caused by the built-in poly seam, accordingly it is the primary object of the present invention to provide a method for manufacturing a field effect transistor having a widened trench that produces a widened the trench having a width larger than the lower trench does, so that a poly seam would be avoided while in depositing the polysilicon layer.

In the present invention, the method for manufacturing a field effect transistor having a widened trench includes: a step (a) of providing a substrate and forming an epitaxial layer on the substrate; a step (b) of forming a first oxidation layer on the epitaxial layer and a first nitride layer on the first oxidation layer; a step (c) of etching sequentially part of the first nitride layer and part of the first oxidation layer so as to form a first residual nitride layer and a first residual oxidation layer, respectively, and etching the epitaxial layer to form a trench extending in a vertical direction, wherein the trench has a trench sidewall and a trench bottom; a step (d) of forming a first trench-oxidation layer over top surfaces and lateral surfaces of the first residual nitride layer, inner lateral surfaces of the first residual oxidation layer, the trench sidewall and the trench bottom, wherein the first trench-oxidation layer consists of a trench portion and a top-cover portion; wherein the trench portion is adhered to the trench, and the top-cover portion covers the first residual nitride layer; a step (e) of forming a second trench-oxidation layer at part of the trench portion lower than the first residual nitride layer and forming a first polysilicon layer over the top-cover portion, the trench portion and the second trench-oxidation layer; a step (f) of etching part of the first polysilicon layer, the top-cover portion, part of the trench portion, part of the second trench-oxidation layer and part of the first residual oxidation layer so as to form a second residual oxidation layer from the residual second trench-oxidation layer inside the trench, forming an electrode portion from the residual first polysilicon layer remained in the second residual oxidation layer, and forming a third residual oxidation layer from the first residual oxidation layer; a step (g) of etching part of the first residual nitride layer and part of the third residual oxidation layer to form a second residual nitride layer and a fourth residual oxidation layer, respectively; a step (h) of etching the epitaxial layer to form a lower trench from a portion of the trench adjacent to the trench bottom and forming a widened trench by widening another portion of the trench away from the trench bottom but connecting the lower trench so as to dispose the electrode portion and the second residual oxidation layer at the lower trench; a step (i) of removing the second residual nitride layer and the fourth residual oxidation layer and forming a gate oxidation layer over the epitaxial layer, a sidewall of the widened trench, the second residual oxidation layer and the electrode portion; a step (j) of forming a gate portion on the gate oxidation layer, wherein the gate portion is separated from the electrode portion by the gate oxidation layer; a step (k) of forming sequentially a body region and a source region at the epitaxial layer by closing to the gate portion; a step (l) of forming an interlayer dielectric layer to cover the source region and the gate portion; and, a step (m) of forming a source electrode to cover the body region and the interlayer dielectric layer and to contact the source region so as to produce the field effect transistor having the widened trench.

In one embodiment of the present invention, the second residual oxidation layer of the step (f) has a concave structure descending from the trench sidewall toward a center of the trench, and the gate oxidation layer of the step (i) fills concave structure. In addition, in the step (i), a thermal oxidation process is applied to form a first sub-gate oxidation layer, and then a deposition process is applied to the first sub-gate oxidation layer to form a second sub-gate oxidation layer, such that the first sub-gate oxidation layer and the second sub-gate oxidation layer are integrated to form the gate oxidation layer, wherein the deposition process is a high density plasma (HDP) deposition process.

In one embodiment of the present invention, the step (i) further includes a step (i0) of applying a chemical mechanical polishing (or called chemical mechanical planarization, CMP) onto the fourth residual oxidation layer of the epitaxial layer. In addition, the step (j) further includes a step (j0) of forming a second polysilicon layer on the gate oxidation layer and etching part of the second polysilicon layer so as to form the gate portion from the residual second polysilicon layer in the widened trench.

In one embodiment of the present invention, in the step (g), a wet etching process is applied to etch part of the first residual nitride layer. In addition, in the step (h), a dry etching process is applied to etch the epitaxial layer.

By providing the method for manufacturing a field effect transistor having a widened trench of the present invention, for the width of the widened trench is larger than that of the lower trench, thus, while in depositing the polysilicon layer, no poly seam would be formed. Thereupon, formation of the poly seam would be avoided, unexpected element damages would be reduced, chip reliability would be raised, and problems of unstable critical voltages and excessive current leakage would be effectively resolved.

All these objects are achieved by the method for manufacturing a field effect transistor having a widened trench described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a method for manufacturing a field effect transistor having a widened trench. In the following description, numerous details are set forth in order to provide a thorough understanding of the present invention. It will be appreciated by one skilled in the prior art that variations of these specific details are possible while still achieving the results of the present invention. In other instance, well-known components are not described in detail in order not to unnecessarily obscure the present invention.

Figure 1:
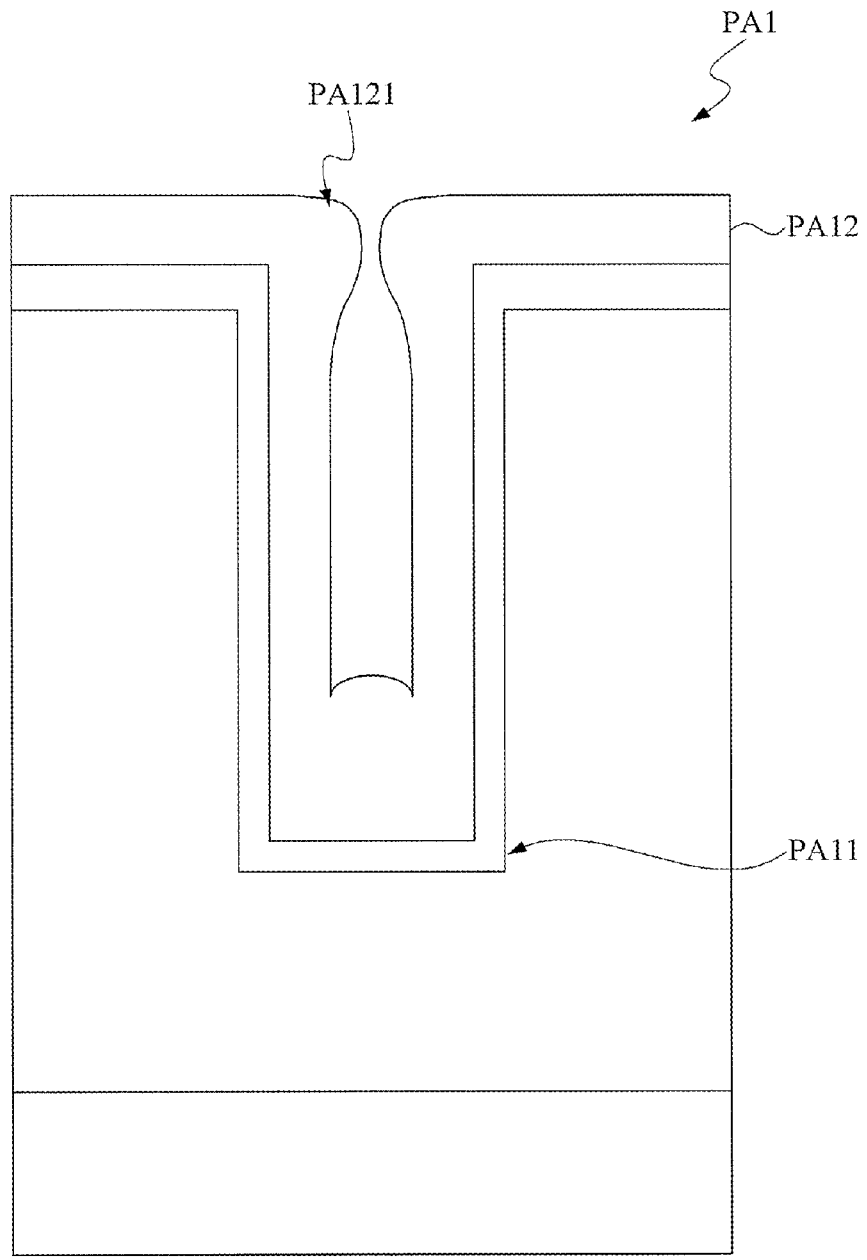
FIG. 1 is a schematic view of a conventional deposited polysilicon layer in the prior art.
Figure 2:
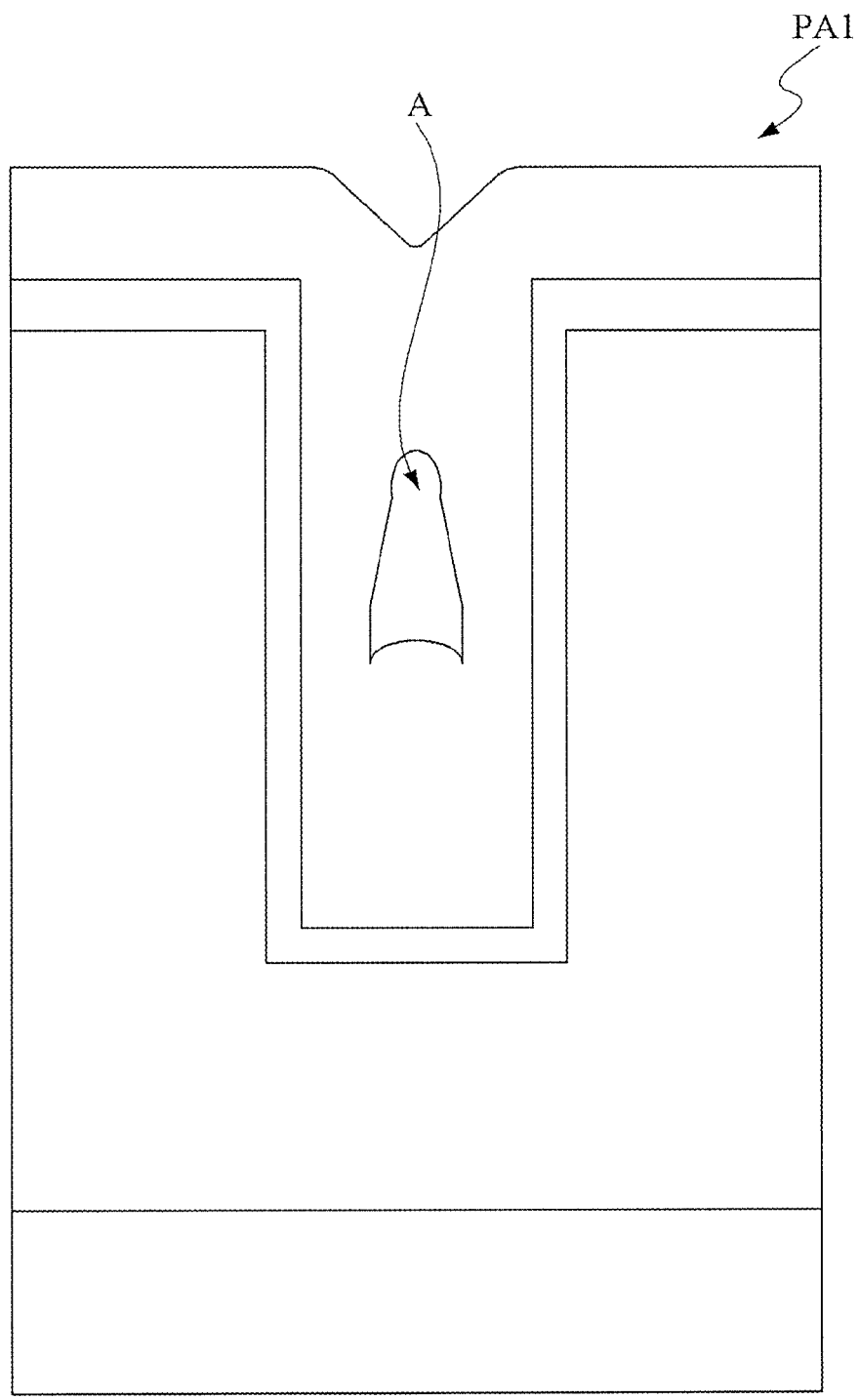
FIG. 2 is a schematic view of another conventional deposited polysilicon layer in the prior art.
Figure 3:
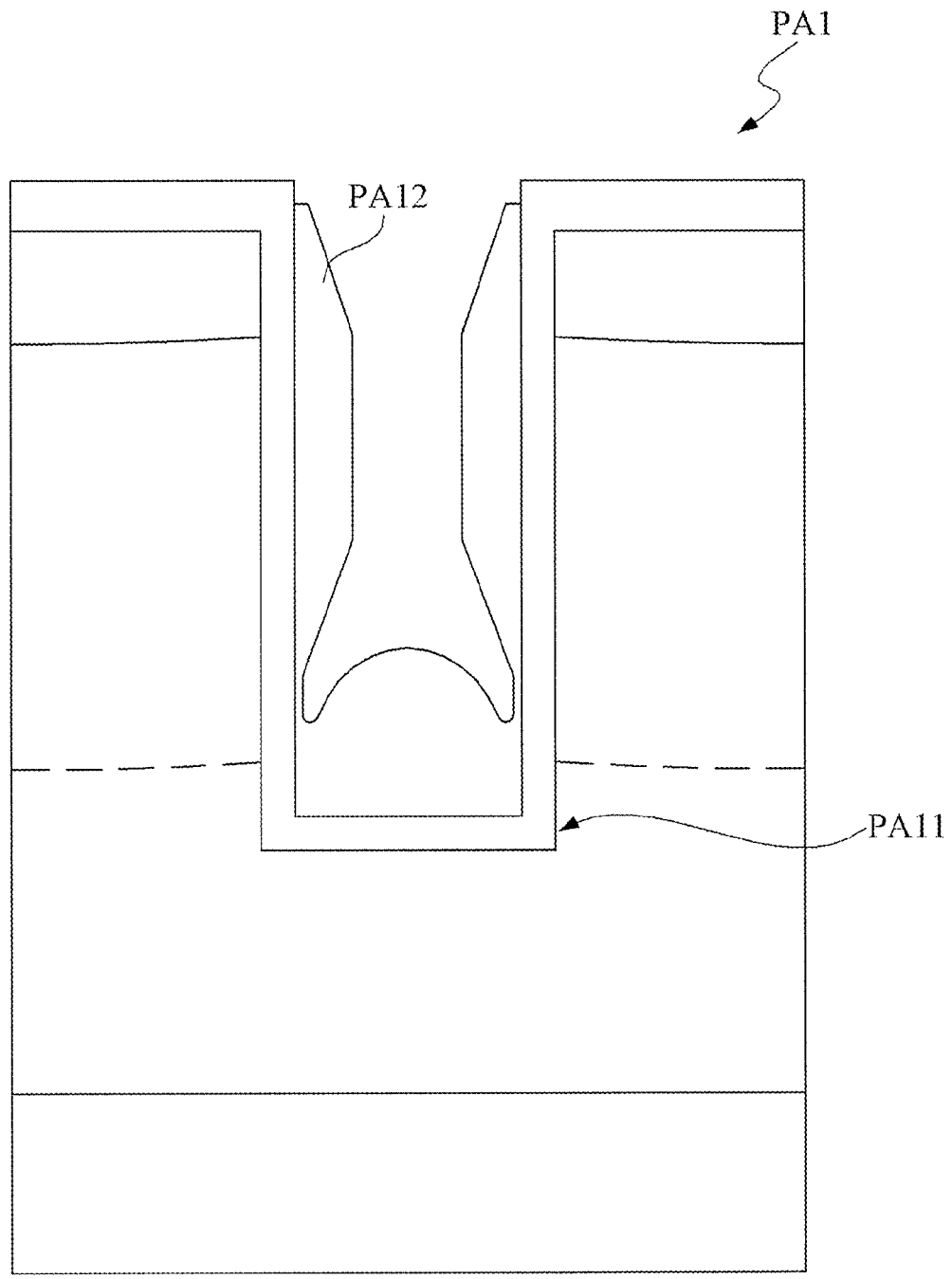
FIG. 3 is a schematic view of a conventional etched polysilicon layer in the prior art.
Figure 4:
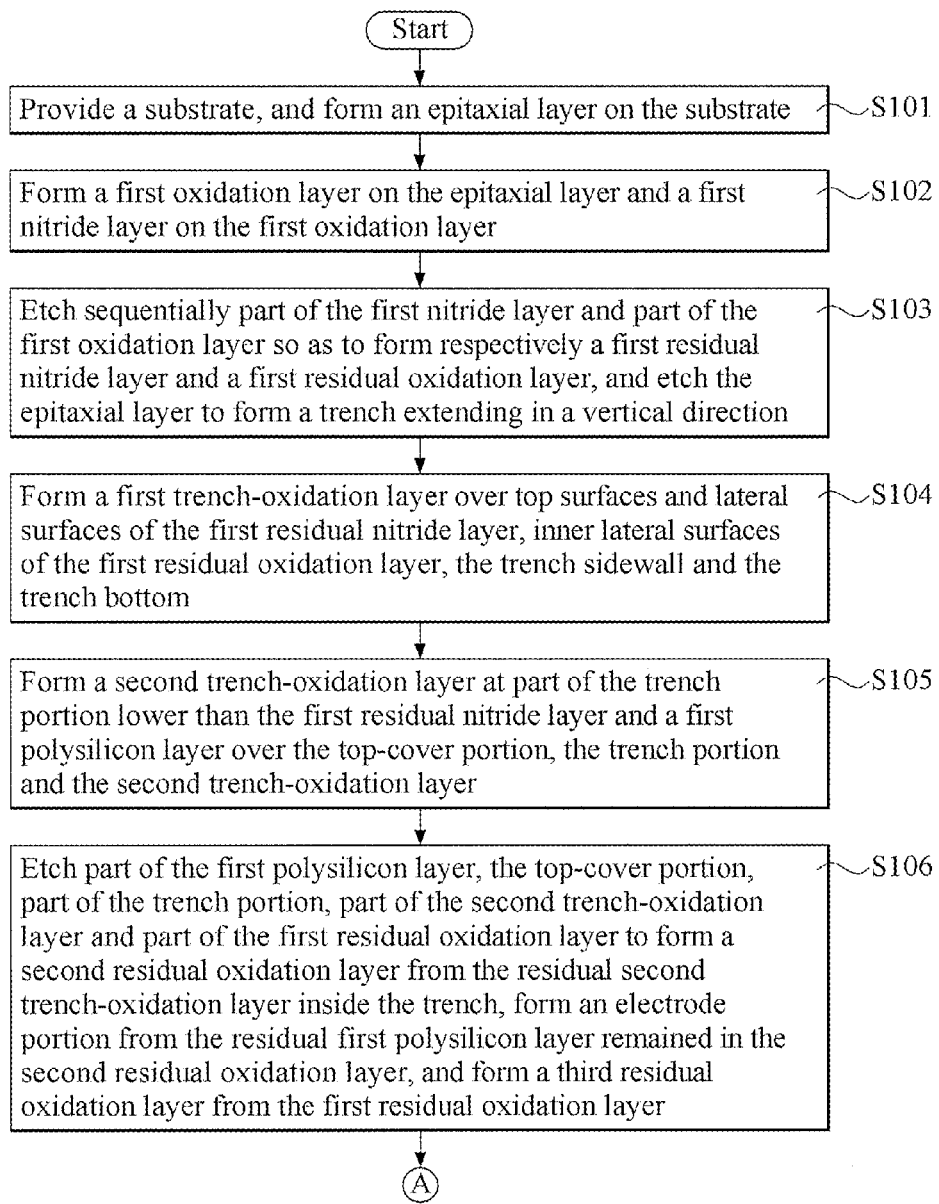
FIG. 4 and FIG. 4A show integrally a flowchart of a preferred embodiment of the method for manufacturing a field effect transistor having a widened trench in accordance with the present invention.
Figure 4A:
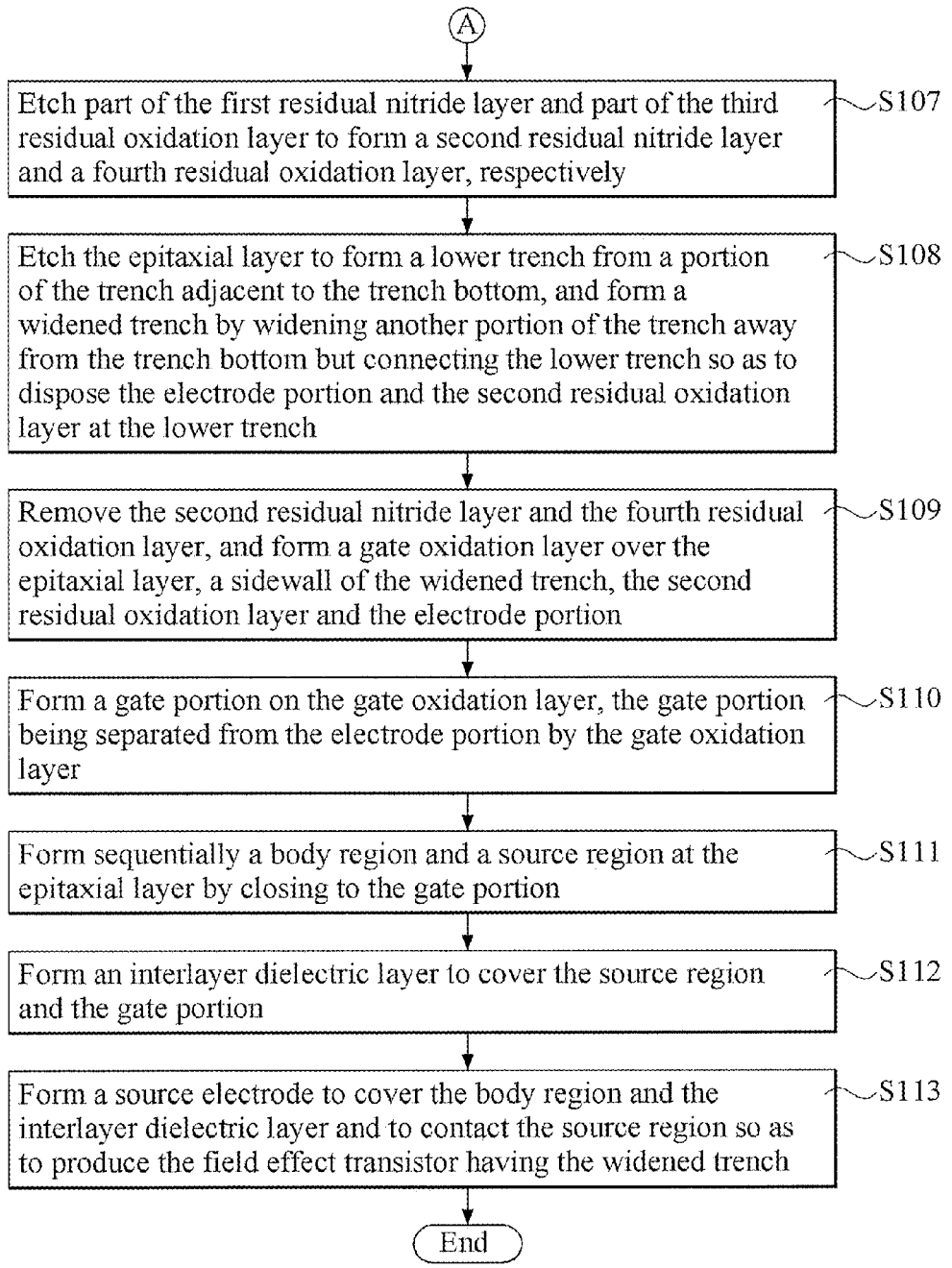
Figure 5:
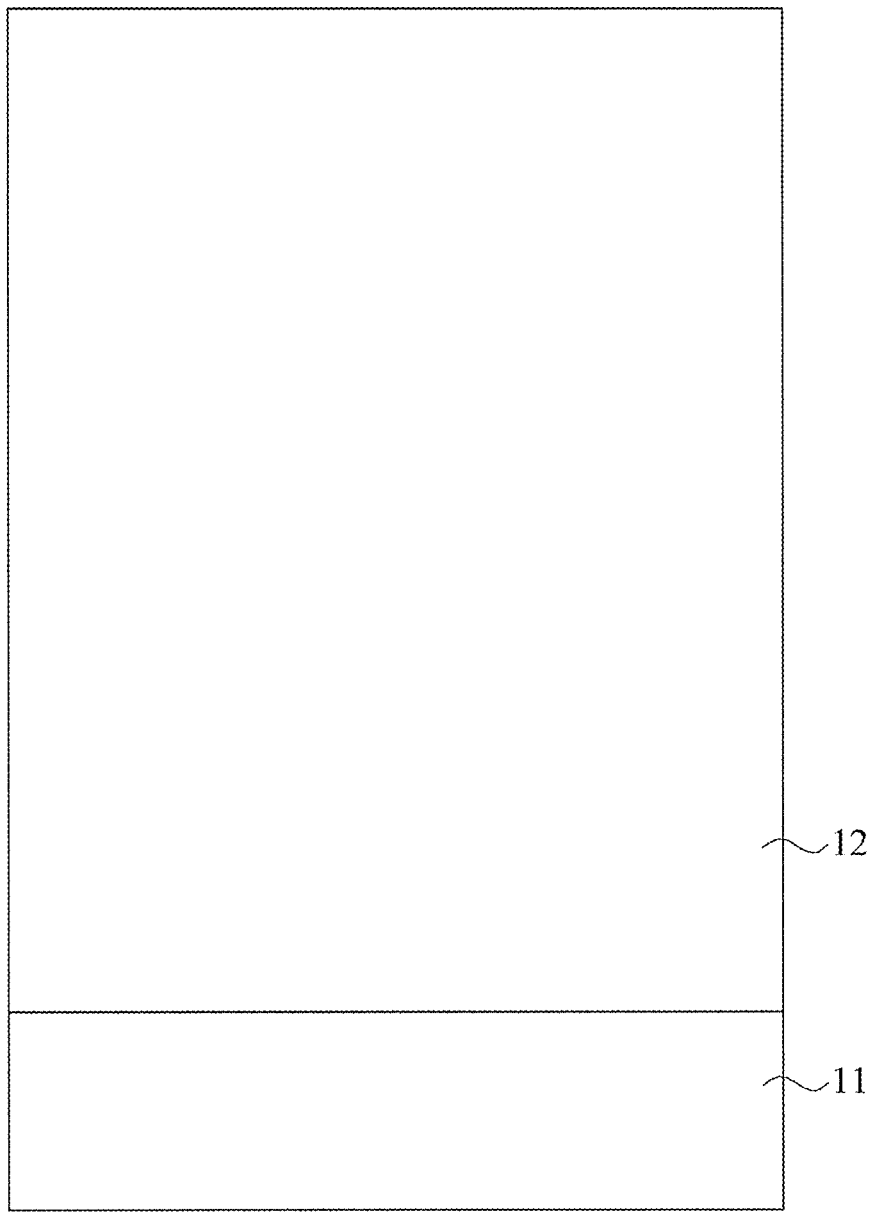
FIG. 5 is a schematic cross-sectional view of a semiconductor substrate and an epitaxial layer for FIG. 4 and FIG. 4A.
Figure 6:
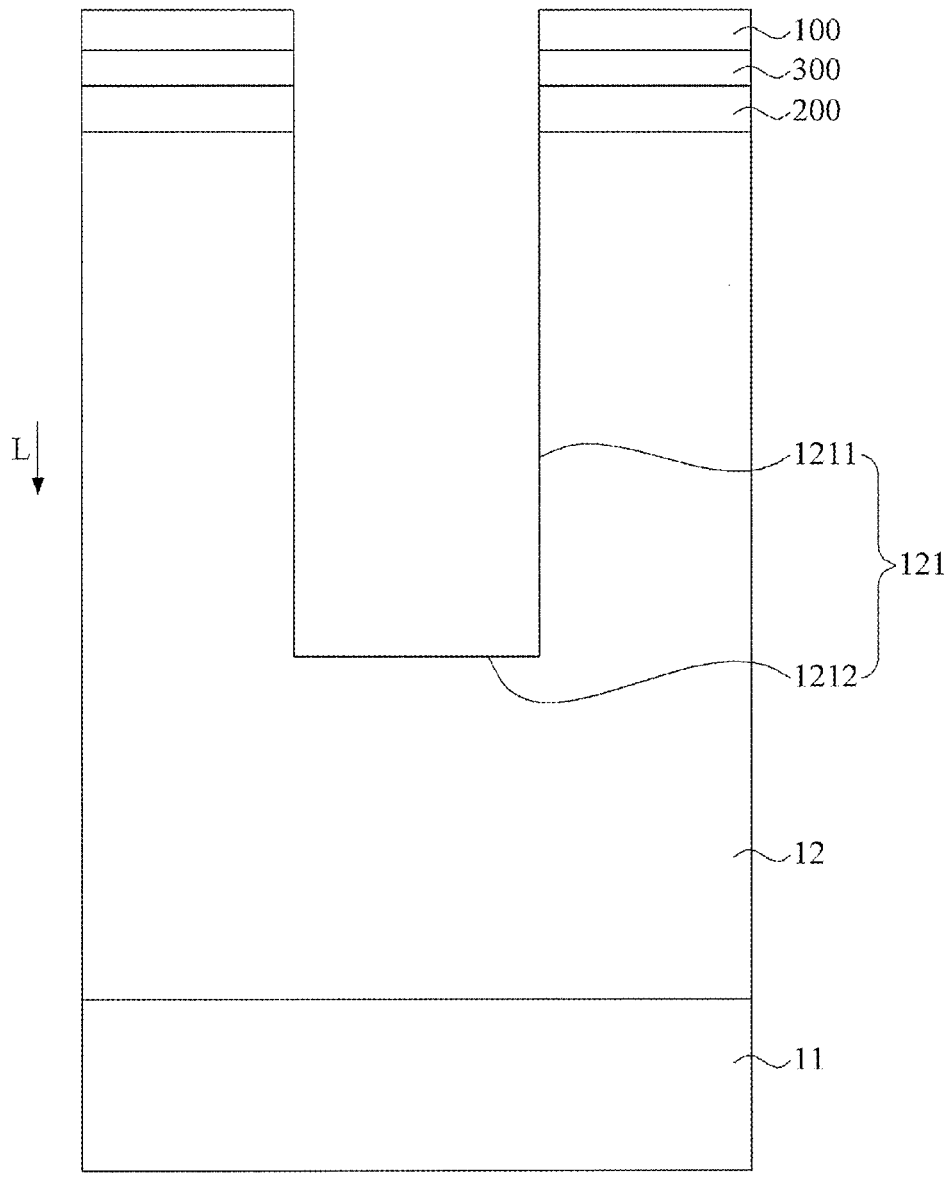
FIG. 6 is a schematic cross-sectional view of a trench formed from etching the epitaxial layer of FIG. 5.
Figure 7:
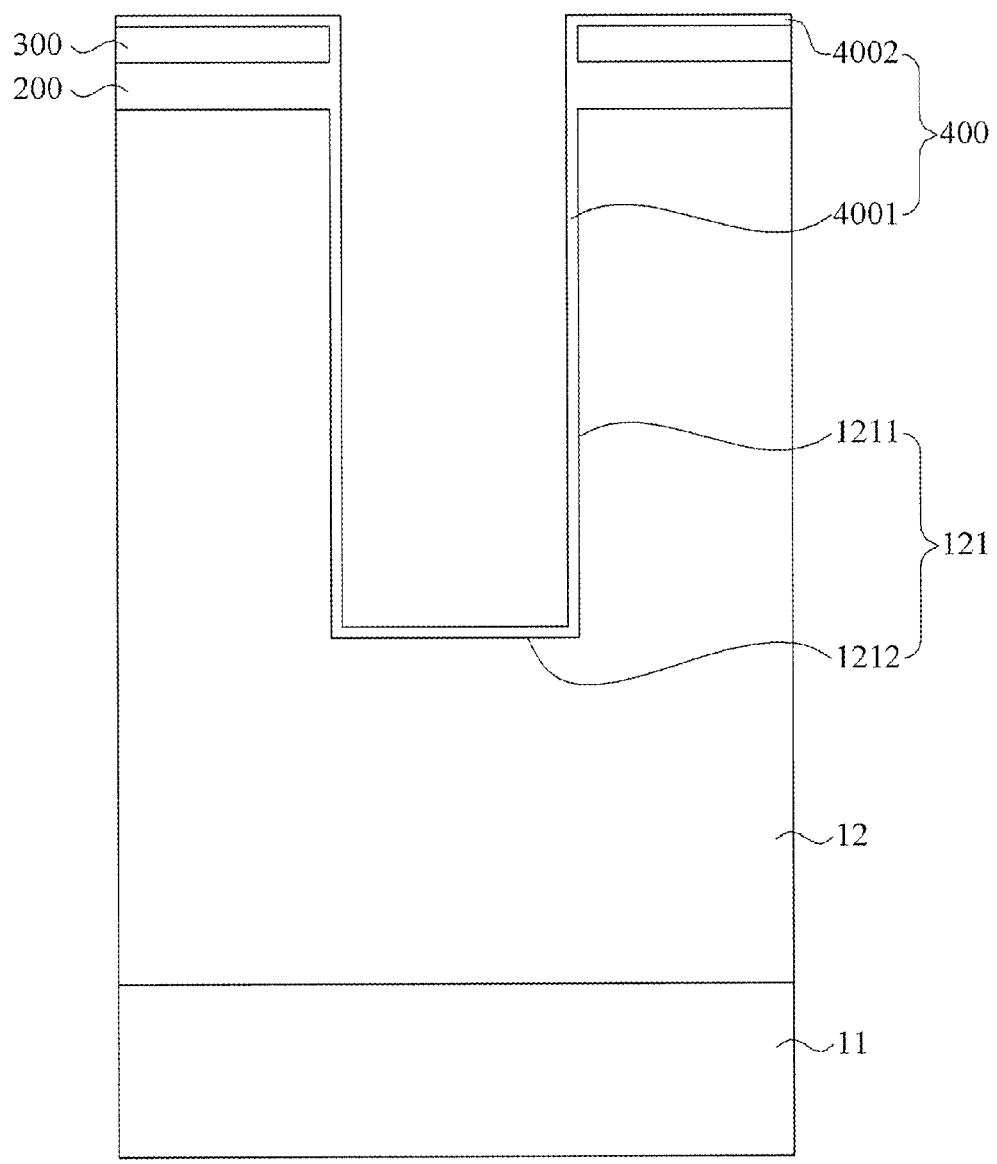
FIG. 7 is a schematic cross-sectional view of a first trench-oxidation layer formed from the trench of FIG. 6.
Figure 8:
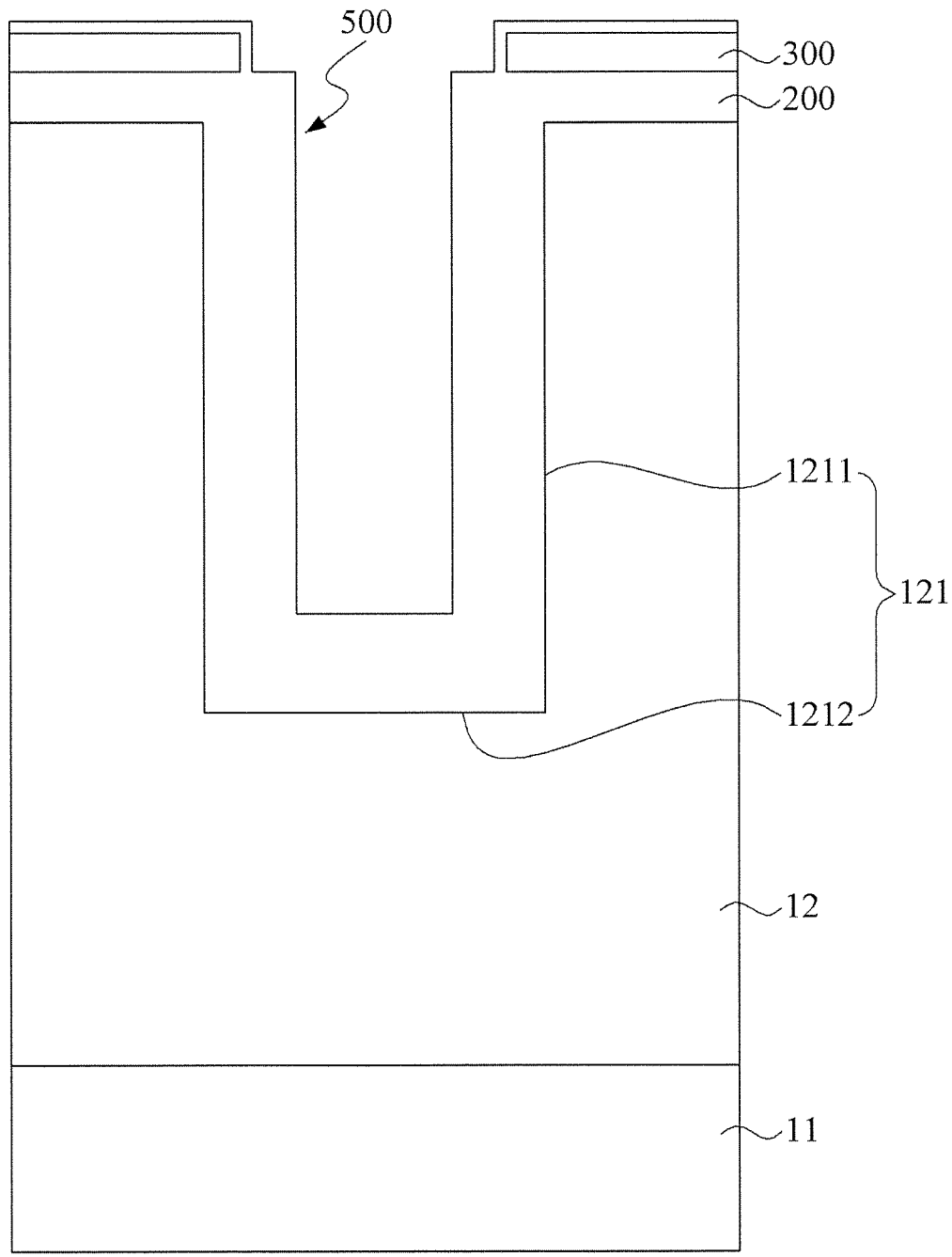
FIG. 8 is a schematic cross-sectional view of a second trench-oxidation layer formed from the trench of FIG. 7.
Figure 9:
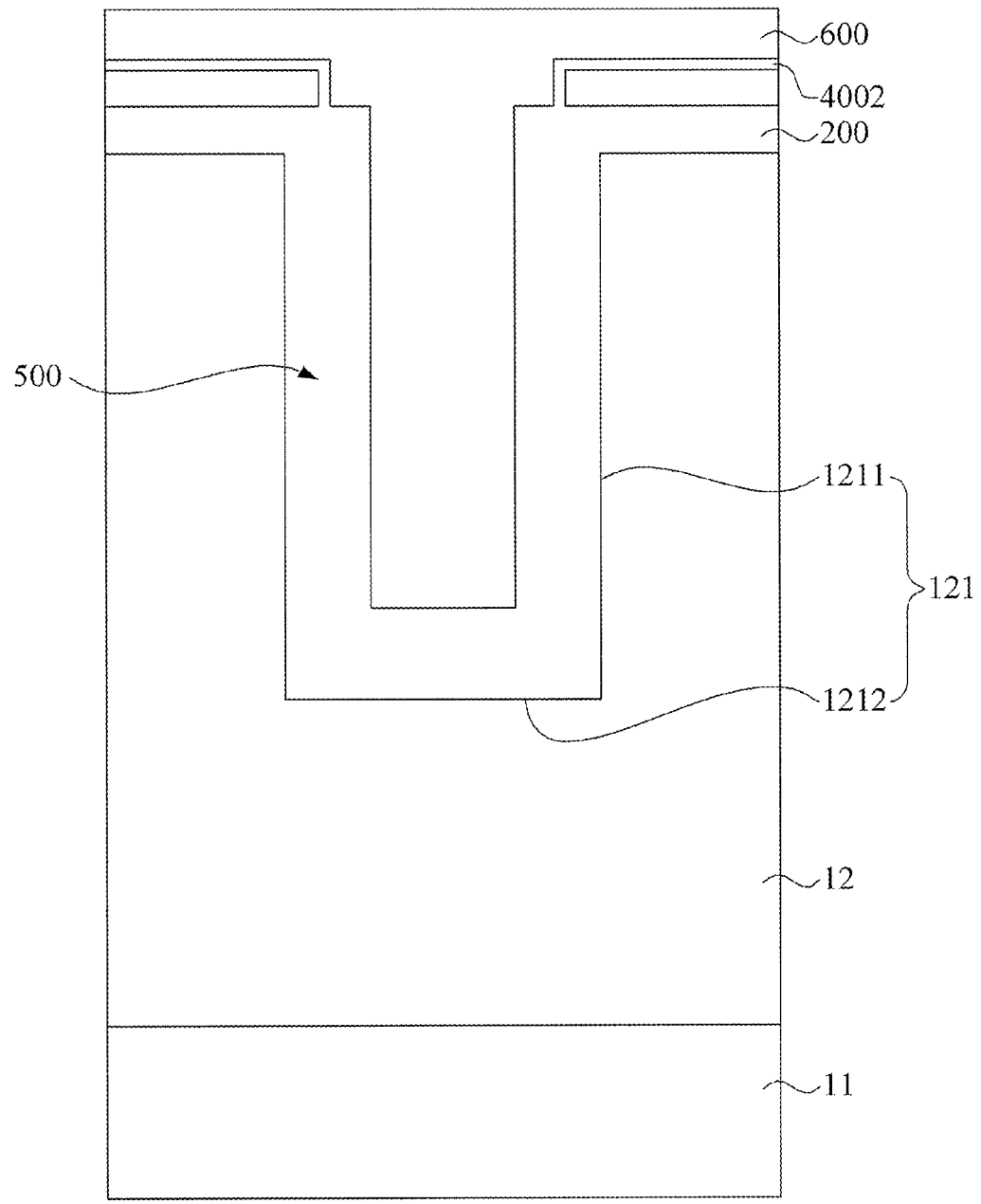
FIG. 9 is a schematic cross-sectional view of a first polysilicon layer formed from the second trench-oxidation layer of FIG. 8.
Figure 10:
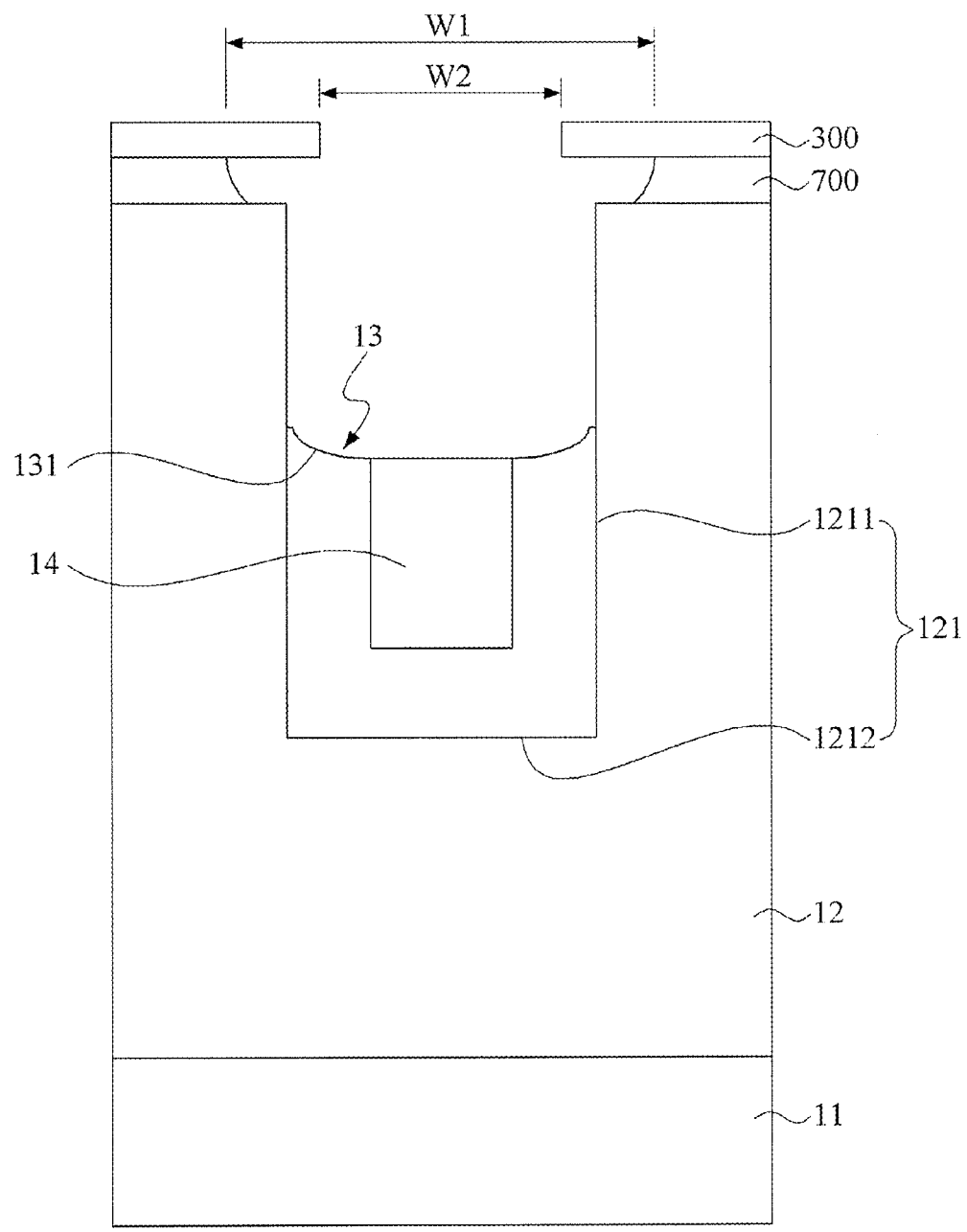
FIG. 10 is a schematic cross-sectional view of a second residual oxidation layer formed from FIG. 9.
Figure 11:
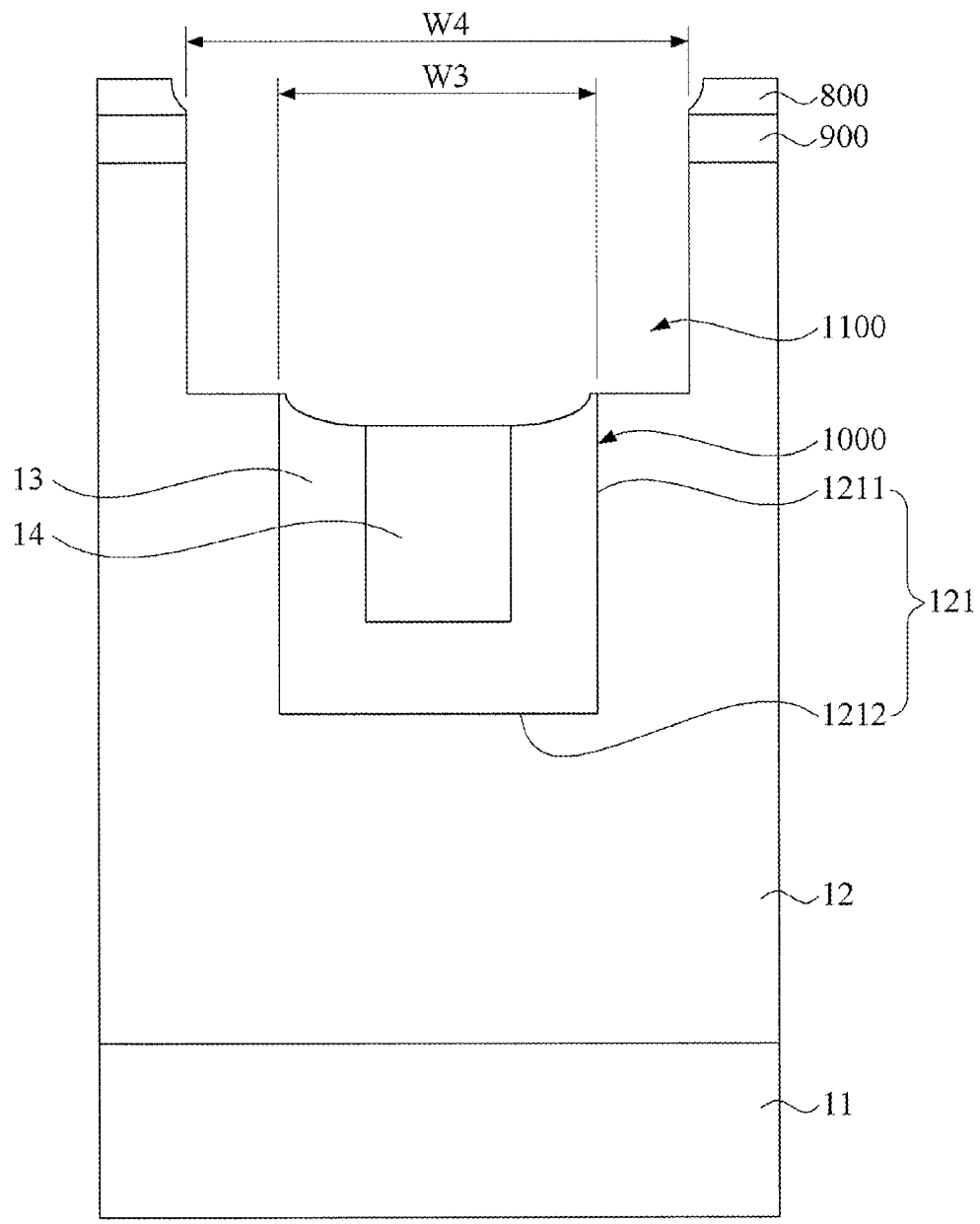
FIG. 11 is a schematic cross-sectional view of a lower trench and a widened trench formed from FIG. 10.
Figure 12:
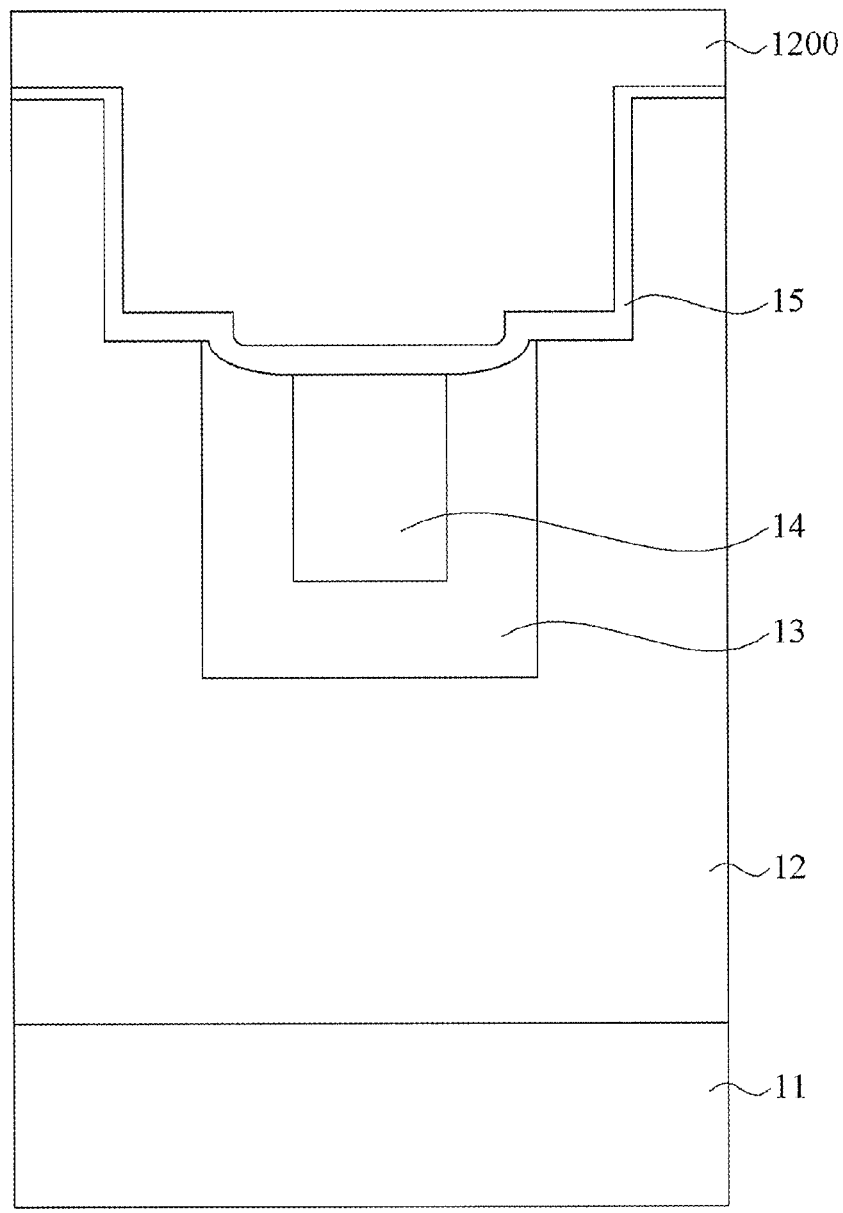
FIG. 12 is a schematic cross-sectional view of a second polysilicon layer formed from the widened trench of FIG. 11.
Figure 13:
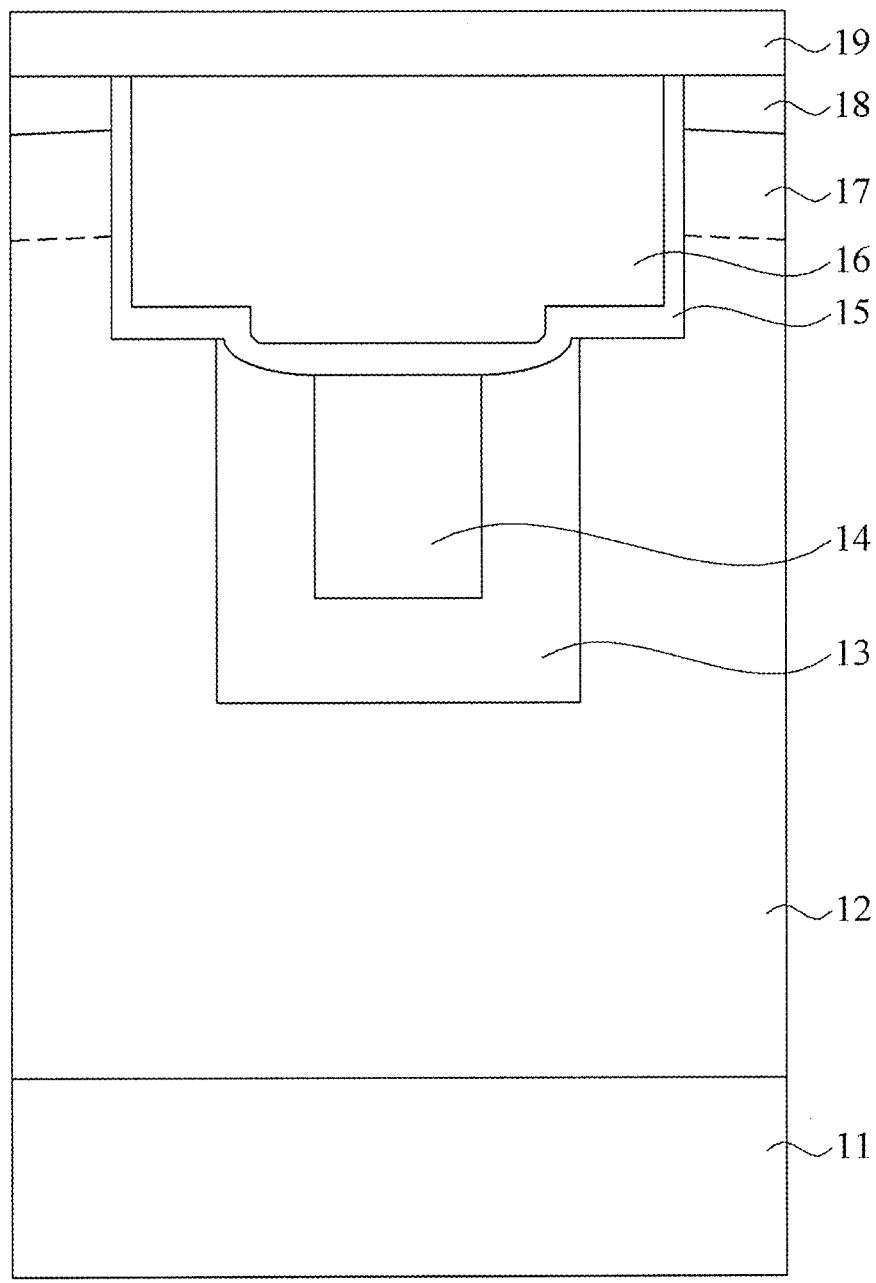
FIG. 13 is a schematic cross-sectional view of an interlayer dielectric layer Ruined from FIG. 12.
Figure 14:
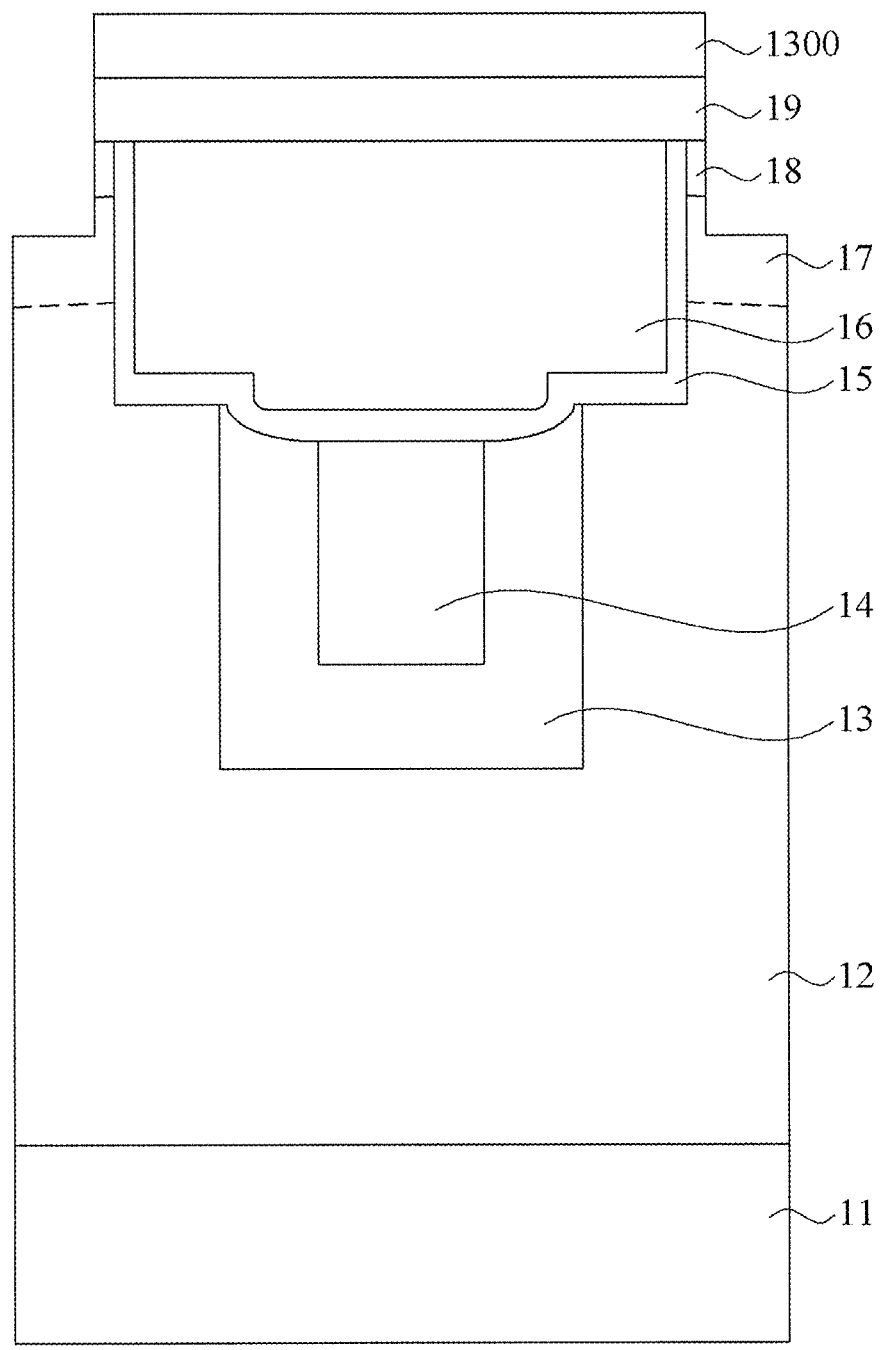
FIG. 14 is a schematic cross-sectional view of forming a mask layer and etching part of the body region and the source region from FIG. 14.
Figure 15:
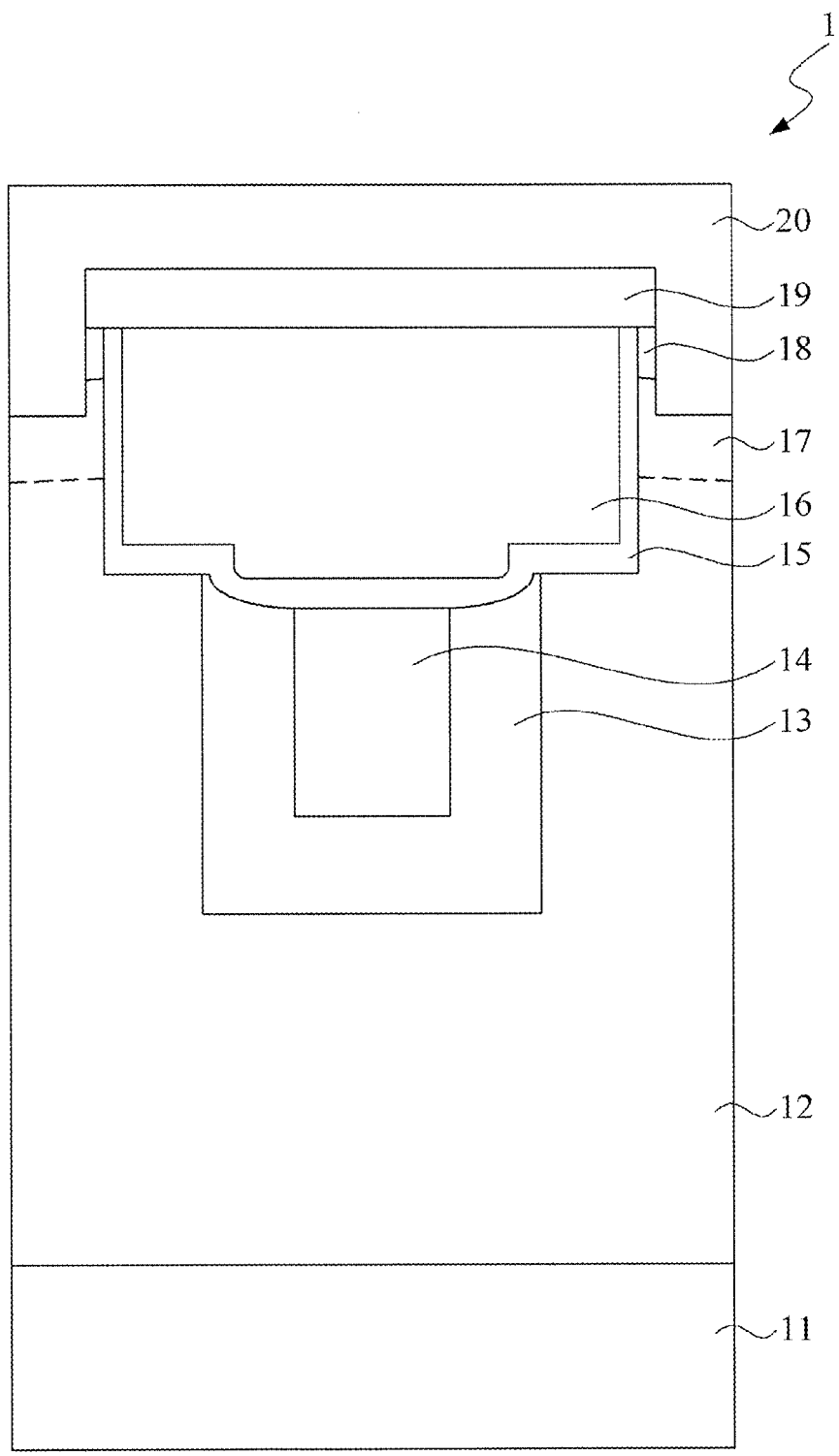
FIG. 15 is a schematic cross-sectional view of a preferred field effect transistor having a widened trench manufactured by the preferred method of FIG. 4 and FIG. 4A.

Refer now to FIG. 4 through FIG. 15; where FIG. 4 and FIG. 4A show integrally a flowchart of a preferred embodiment of the method for manufacturing a field effect transistor having a widened trench in accordance with the present invention, FIG. 5 is a schematic cross-sectional view of a semiconductor substrate and an epitaxial layer for FIG. 4 and FIG. 4A, FIG. 6 is a schematic cross-sectional view of a trench formed from etching the epitaxial layer of FIG. 5, FIG. 7 is a schematic cross-sectional view of a first trench-oxidation layer formed from the trench of FIG. 6, FIG. 8 is a schematic cross-sectional view of a second trench-oxidation layer formed from the trench of FIG. 7, FIG. 9 is a schematic cross-sectional view of a first polysilicon layer formed from the second trench-oxidation layer of FIG. 8, FIG. 10 is a schematic cross-sectional view of a second residual oxidation layer formed from FIG. 9, FIG. 11 is a schematic cross-sectional view of a lower trench and a widened trench formed from FIG. 10, FIG. 12 is a schematic cross-sectional view of a second polysilicon layer formed from the widened trench of FIG. 11, FIG. 13 is a schematic cross-sectional view of an interlayer dielectric layer formed from FIG. 12, FIG. 14 is a schematic cross-sectional view of forming a mask layer and etching part of the body region and the source region from FIG. 13, and FIG. 15 is a schematic cross-sectional view of a preferred field effect transistor having a widened trench manufactured by the preferred method of FIG. 4 and FIG. 4A.

As shown in FIG. 5, Step S101 is firstly performed to provide a substrate 11, and an epitaxial layer 12 is formed on the substrate 11. Herein, related forming methods are various and all already mature in the art, and thus details thereabout are omitted. In the present invention, the substrate 11 is generally doped with ion concentration (N-type for example), the epitaxial layer 12 is also generally doped with another ion concentration (N-type for example), and the ion concentration of the epitaxial layer 12 is lower than that of the substrate 11. However, all the related technology is well known in the art, and thus details thereabout would be omitted herein.

After Step S101 is finished, Step S102 is performed to form a first oxidation layer (not labeled in the figure) over the epitaxial layer 12, and further to form a first nitride layer (not labeled in the figure) over the first oxidation layer. In these steps, a photoresist layer 100 can be further formed over the first nitride layer. Again, all the related technology herein is well known in the art, and thus details thereabout would be omitted. However, it shall be noted that materials for the oxidation layer and the nitride layer are well known in the art, and details thereabout would be also omitted herein.

Then, Step S103 is performed to sequentially etch part of the first nitride layer and part of the first oxidation layer, so as to form a first residual nitride layer 300 and a first residual oxidation layer 200, respectively. Also, a trench 121 extending in a vertical direction L is formed by etching the epitaxial layer 12. Here and in the following description, the etching technology and options thereof are all well known in the art, and details thereabout would be omitted. Further, as shown, the trench 121 has a trench sidewall 1211 and a trench bottom 1212.

In addition, it shall be noted that, in this present invention, the trench sidewall 1211 stands for the entire sidewall of the trench 121. Namely, in a top view, all sidewalls are connected, unlike two separate sidewalls shown in the cross-sectional view. However, in other embodiments, the trench sidewall 1211 may also stand for two separate sidewalls in the trench 121.

As shown in FIG. 7, Step S104 is then performed to form a first trench-oxidation layer 400 over top surfaces and lateral surfaces of the first residual nitride layer 300, inner lateral surfaces of the first residual oxidation layer 200, the trench sidewall 1211 and the trench bottom 1212. Also, the first trench-oxidation layer 400 consists of a trench portion 4001 and a top-cover portion 4002. The trench portion 4001 is adhered to lateral sides of the trench 121 and the first residual oxidation layer 200, the top-cover portion 4002 covers the first residual nitride layer 300, and the trench portion 4001 is connected with the top-cover portion 4002.

As shown in FIG. 8 and FIG. 9, Step S105 is performed to form a second trench-oxidation layer 500 at part of the trench portion 4001 that is lower than the first residual nitride layer 300, and then to form a first polysilicon layer 600 over the top-cover portion 4002, the trench portion 4001 and the second trench-oxidation layer 500. In the present invention, candidate materials for the polysilicon layer are well known in the art, and details thereabout would be omitted herein. In practice, the second trench-oxidation layer 500 is defined strictly to locate below the first residual nitride layer 300, and the second trench-oxidation layer 500 includes the first residual oxidation layer 200 and the trench portion 4001 of the first trench-oxidation layer 400. While in forming the second trench-oxidation layer 500, the second trench-oxidation layer 500 would be made thicker due to oxidation of the trench sidewall 1211 and the trench bottom 1212 of the trench 121.

As shown in FIG. 9 and FIG. 10, Step S106 is performed to etch part of the first polysilicon layer 600, the top-cover portion 4002, part of the trench portion 4001, part of the second trench-oxidation layer 500 and part of the first residual oxidation layer 200, so as to form a second residual oxidation layer 13 inside the trench 121 from the residual second trench-oxidation layer 500. Also, the residual first polysilicon layer 600 remained in the second residual oxidation layer 13 is formed as an electrode portion 14, and the first residual oxidation layer 200 is formed as a third residual oxidation layer 700. In practice, a width W1 of the trench 121 at the level of the third residual oxidation layer 700 is larger than a width W2 of the trench 121 at the level of the first residual nitride layer 300. In addition, the second residual oxidation layer 13 has a concave structure 131 descending from the trench sidewall 1211 toward a center of the trench 121, and the concave structure 131 contacts at the trench sidewall 1211.

As shown in FIG. 11, Step S107 is performed to etch part of the first residual nitride layer 300 and part of the third residual oxidation layer 700 so as to form a second residual nitride layer 800 and a fourth residual oxidation layer 900, respectively. In Step S107, a wet etching process is applied to etch part of the first residual nitride layer 300, while a dry etching process is applied to etch part of the third residual oxidation layer 700.

Referring also to FIG. 11, Step S108 is performed to etch the epitaxial layer 12 so as to form a lower trench 1000 from a portion of the trench 121 adjacent to the trench bottom 1212, and to form a widened trench 1100 by widening another portion of the trench 121 that is away from the trench bottom 1212 but connects the lower trench 1000, such that the electrode portion 14 and the second residual oxidation layer 13 can be disposed at the lower trench 1000. In the present invention, a width W3 of the lower trench 1000 is smaller than a width W4 of the widened trench 1100. In particular, in Step S108, a dry etching process is applied to etch the epitaxial layer 12 so as to define the trench 121 into the lower trench 1000 and the widened trench 1100.

As shown in FIG. 11 and FIG. 12, Step S109 is performed to remove the second residual nitride layer 800 and the fourth residual oxidation layer 900, and to form a gate oxidation layer 15 over the epitaxial layer 12, the sidewall of the widened trench 1100, the second residual oxidation layer 13 and the electrode portion 14. Further, the gate oxidation layer 15 fills the concave structure 131.

It shall be noted that, while in forming the gate oxidation layer 15 in Step S109, a chemical mechanical polishing (or called as a chemical mechanical planarization, CMP) is firstly applied onto the fourth residual oxidation layer 900 of the epitaxial layer 12, then a thermal oxidation process is applied to form a first sub-gate oxidation layer (not labeled in the figure), and finally a deposition process is applied to the first sub-gate oxidation layer to form a second sub-gate oxidation layer (not labeled in the figure), such that the first sub-gate oxidation layer and the second sub-gate oxidation layer are integrated to form the gate oxidation layer 15. In the present invention, the deposition process can be, but not limited to, a high density plasma (HDP) deposition process. Also, the application of the thermal oxidation process can improve regularity of lattice arrangement of surface crystals, so as further to enhance the smoothness. In addition, by applying the two-stage process to form the gate oxidation layer 15, generation of dimples in the following process can be effectively inhibited.

As shown in FIG. 12 and FIG. 13, Step S110 is performed to form a gate portion 16 on the gate oxidation layer 15, in which the gate portion 16 is separated from the electrode portion 14 by the gate oxidation layer 15. In the present invention, in forming the gate portion 16, a second polysilicon layer 1200 is formed on the gate oxidation layer 15, and part of the second polysilicon layer 1200 is etched, such that the residual second polysilicon layer 1200 can form as a gate portion 16 in the widened trench 1100 to top the gate oxidation layer 15.

As shown in FIG. 13, Step S111 is performed to form sequentially a body region (P-body) 17 and a source region (N+) 18 at the epitaxial layer 12 by closing to the gate portion 16. The formation method can be various but all well known in the art, and thus details thereabout are omitted herein. As shown, the body region 17 is separated from the gate portion 16 by the gate oxidation layer 15, and the source region 18 is separated from the gate portion 16 by the gate oxidation layer 15. Then, Step S112 is performed to form an interlayer dielectric layer (ILD) 19 to cover the source region 18 and the gate portion 16.

As shown in FIG. 14, a mask layer 1300 is formed on the interlayer dielectric layer 19, part of the body region 17 and the source region 18 are etched, and finally the mask layer 1300 is removed.

As shown in FIG. 15, Step S113 is finally performed to form a source electrode 20 to cover the body region 17 and the interlayer dielectric layer 19 and to contact the source region 18. Thereupon, the field effect transistor 1 having a widened trench produced by the preferred method of FIG. 4 and FIG. 4A is obtained, in which the source electrode 20 is shaped as a "n" structure.

In summary, by providing the method for manufacturing a field effect transistor having a widened trench of the present invention, for the width of the widened trench is larger than that of the lower trench, thus, while in depositing the polysilicon layer, no poly seam would be formed. Thereupon, formation of the poly seam would be avoided, unexpected element damages would be reduced, chip reliability would be raised, and problems of unstable critical voltages and excessive current leakage would be effectively resolved.

While the present invention has been particularly shown and described with reference to a preferred embodiment, it will be understood by those skilled in the prior art that various changes in form and detail may be without departing from the spirit and scope of the present invention.

What is claimed is:

1. A method for manufacturing a field effect transistor having a widened trench, comprising the steps of:
   (a) providing a substrate, and forming an epitaxial layer on the substrate;
   (b) forming a first oxidation layer on the epitaxial layer, and forming a first nitride layer on the first oxidation layer;
   (c) etching sequentially part of the first nitride layer and part of the first oxidation layer so as to form a first residual nitride layer and a first residual oxidation layer, respectively, and etching the epitaxial layer to form a trench extending in a vertical direction, wherein the trench has a trench sidewall and a trench bottom;
   (d) forming a first trench-oxidation layer over top surfaces and lateral surfaces of the first residual nitride layer, inner lateral surfaces of the first residual oxidation layer, the trench sidewall and the trench bottom; wherein the first trench-oxidation layer consists of a trench portion and a top-cover portion; wherein the trench portion is adhered to the trench, and the top-cover portion covers the first residual nitride layer;
   (e) forming a second trench-oxidation layer at part of the trench portion lower than the first residual nitride layer, and forming a first polysilicon layer over the top-cover portion, the trench portion and the second trench-oxidation layer;
   (f) etching part of the first polysilicon layer, the top-cover portion, part of the trench portion, part of the second trench-oxidation layer and part of the first residual oxidation layer so as to form a second residual oxidation layer from the residual second trench-oxidation layer inside the trench, forming an electrode portion from the residual first polysilicon layer remained in the second residual oxidation layer, and forming a third residual oxidation layer from the first residual oxidation layer;
   (g) etching part of the first residual nitride layer and part of the third residual oxidation layer to form a second residual nitride layer and a fourth residual oxidation layer, respectively;
   (h) etching the epitaxial layer to foim a lower trench from a portion of the trench adjacent to the trench bottom, and forming a widened trench by widening another portion of the trench away from the trench bottom but connecting the lower trench, so as to dispose the electrode portion and the second residual oxidation layer at the lower trench;
   (i) removing the second residual nitride layer and the fourth residual oxidation layer, and forming a gate oxidation layer over the epitaxial layer, a sidewall of the widened trench, the second residual oxidation layer and the electrode portion;
   (j) forming a gate portion on the gate oxidation layer, wherein the gate portion is separated from the electrode portion by the gate oxidation layer;
   (k) forming sequentially a body region and a source region at the epitaxial layer by closing to the gate portion;
   (l) forming an interlayer dielectric layer to cover the source region and the gate portion; and
   (m) forming a source electrode to cover the body region and the interlayer dielectric layer and to contact the source region, so as to produce the field effect transistor having the widened trench.

2. The method for manufacturing a field effect transistor having a widened trench of claim 1, wherein, in the Step (f), the second residual oxidation layer has a concave structure descending from the trench sidewall toward a center of the trench.

3. The method for manufacturing a field effect transistor having a widened trench of claim 2, wherein, in the Step (i), the gate oxidation layer fills the concave structure.

4. The method for manufacturing a field effect transistor having a widened trench of claim 1, wherein, in the Step (i), a thermal oxidation process is applied to form a first sub-gate oxidation layer, and then a deposition process is applied to the first sub-gate oxidation layer to foriii a second sub-gate oxidation layer, such that the first sub-gate oxidation layer and the second sub-gate oxidation layer are integrated to form the gate oxidation layer.

5. The method for manufacturing a field effect transistor having a widened trench of claim 4, wherein the deposition process is a high density plasma (HDP) deposition process.

6. The method for manufacturing a field effect transistor having a widened trench of claim 1, wherein the Step (i) further includes a Step (i0) of applying a chemical mechanical polishing (or called chemical mechanical planarization, CMP) onto the fourth residual oxidation layer of the epitaxial layer.

7. The method for manufacturing a field effect transistor having a widened trench of claim 1, wherein the Step (j) further includes a Step (j0) of forming a second polysilicon layer on the gate oxidation layer and etching part of the second polysilicon layer so as to form the gate portion from the residual second polysilicon layer in the widened trench.

8. The method for manufacturing a field effect transistor having a widened trench of claim 1, wherein, in the Step (g), a wet etching process is applied to etch part of the first residual nitride layer.

9. The method for manufacturing a field effect transistor having a widened trench of claim 1, wherein, in the Step (g), a dry etching process is applied to etch part of the third residual oxidation layer.

10. The method for manufacturing a field effect transistor having a widened trench of claim 1, wherein, in the Step (h), a dry etching process is applied to etch the epitaxial layer.

* * * * *